(12) United States Patent
Yang et al.

(10) Patent No.: US 8,492,265 B2
(45) Date of Patent: Jul. 23, 2013

(54) PAD BONDING EMPLOYING A SELF-ALIGNED PLATED LINER FOR ADHESION ENHANCEMENT

(75) Inventors: Chih-Chao Yang, Glenmont, NY (US); David V. Horak, Essex Junction, VT (US); Takeshi Nogami, Schenectady, NY (US); Shom Ponoth, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/431,254

(22) Filed: Mar. 27, 2012

(65) Prior Publication Data
US 2012/0190187 A1 Jul. 26, 2012

Related U.S. Application Data

(62) Division of application No. 12/575,980, filed on Oct. 8, 2009.

(51) Int. Cl.
*H01L 21/4763* (2006.01)

(52) U.S. Cl.
USPC .................. 438/618; 257/E21.584

(58) Field of Classification Search
USPC ........................................ 438/618
See application file for complete search history.

(56) References Cited

U.S. PATENT DOCUMENTS

| | | | |
|---|---|---|---|
| 5,880,010 A * | 3/1999 | Davidson ...................... | 438/455 |
| 6,835,235 B2 | 12/2004 | Pilgram et al. | |
| 6,835,236 B2 | 12/2004 | Lacey | |
| 6,859,337 B2 | 2/2005 | Oshino et al. | |
| 7,015,580 B2 | 3/2006 | Fitzsimmons et al. | |
| 7,034,219 B2 | 4/2006 | Koo | |
| 7,242,076 B2 | 7/2007 | Dolan | |
| 7,253,503 B1 | 8/2007 | Fusaro et al. | |
| 2003/0157782 A1 | 8/2003 | Kellar et al. | |
| 2004/0048459 A1* | 3/2004 | Patti ............................. | 438/612 |
| 2005/0112861 A1 | 5/2005 | Fitzsimmons et al. | |
| 2005/0121065 A1 | 6/2005 | Otey | |
| 2005/0258520 A1 | 11/2005 | Dolan | |
| 2006/0063472 A1 | 3/2006 | Matsumoto et al. | |
| 2006/0131726 A1 | 6/2006 | Bruch | |
| 2006/0158312 A1 | 7/2006 | Park et al. | |
| 2006/0185498 A1 | 8/2006 | Koo | |
| 2007/0262468 A1* | 11/2007 | Nasu et al. .................... | 257/778 |
| 2008/0006938 A1* | 1/2008 | Patti et al. .................... | 257/734 |
| 2008/0043548 A1 | 2/2008 | Jung et al. | |
| 2008/0067664 A1 | 3/2008 | Lim et al. | |
| 2008/0079148 A1 | 4/2008 | Leung et al. | |
| 2008/0079173 A1 | 4/2008 | Feng et al. | |
| 2008/0096684 A1 | 4/2008 | Lara et al. | |
| 2008/0157302 A1 | 7/2008 | Lee et al. | |

* cited by examiner

*Primary Examiner* — Robert J Hoffberg
*Assistant Examiner* — Igwe U Anya
(74) *Attorney, Agent, or Firm* — Scully, Scott, Murphy & Presser, P.C.; Parashes Kalaitzis, Esq.

(57) ABSTRACT

Two substrates are brought together and placed in a plating bath. In one embodiment, a conductive material is plated in microscopic cavities present at the interface between a first metal pad and a second metal pad to form at least one interfacial plated metal liner portion that adheres to a surface of the first metal pad and a surface of the second metal pad. In another embodiment, at least one metal pad is recessed relative to a dielectric surface before being brought together. The two substrates are placed in a plating bath and a conductive material is plated in the cavity between the first metal pad and the second metal pad to form a contiguous plated metal liner layer that adheres to a surface of the first metal pad and a surface of the second metal pad.

20 Claims, 8 Drawing Sheets

PAD BONDING EMPLOYING A SELF-ALIGNED PLATED LINER FOR ADHESION ENHANCEMENT

CROSS REFERENCE TO RELATED APPLICATION

This application is a divisional of U.S. patent application Ser. No. 12/575,980, filed Oct. 8, 2009 the entire content and disclosure of which is incorporated herein by reference.

BACKGROUND

This invention relates to bonded structures including a self-aligned liner that bonds metal pads located on each side of bonded substrates and methods of manufacturing the same.

Bonding of multiple substrates is required to enable three-dimensional integration of chips. Bonding of two substrates can be effected by adhesion between two dielectric materials as in an oxide-to-oxide bonding that fuses silicon dioxide materials from two substrates after bonding, by adhesion between two metallic materials as in a copper-to-copper bonding that employs direct contact between two copper pads and a subsequent grain growth across the original interface between the two copper pads, or by a method employing a combination of the two adhesion mechanisms.

The effectiveness of currently available bonding methods is limited by the bonding strength, i.e., the mechanical adhesion strength, between the two substrates that are bonded together. Because substrates including semiconductor devices are bonded after semiconductor devices are fully formed within each substrate, the temperature of bonded substrates cannot be raised above a certain limit, typically about 250° C., without adversely affecting semiconductor devices or dielectric material in the substrates. The constraint on the processing temperature after bonding of substrates limits the effectiveness of the fusing of dielectric materials or grain growth of metal across the original bonding interface. However, high mechanical adhesion strength across two bonded substrates is needed to insure reliability in the physical integrity of bonded substrate.

BRIEF SUMMARY

In an embodiment of the present invention, two substrates are brought together so that a first metal pad on a first substrate makes a physical contact with a second metal pad on a second substrate. The two substrates are placed in a plating bath and a conductive material is plated in microscopic cavities present at the interface between the first metal pad and the second metal pad to form at least one interfacial plated metal liner portion that adheres to a surface of the first metal pad and a surface of the second metal pad. The at least one interfacial plated metal liner portion is self-aligned to the contact area between the first and second metal pads, and enhances mechanical adhesion across the first and second metal pads.

In another embodiment of the present invention, a first metal pad on a first substrate is recessed relative to a dielectric surface of the first substrate. The first substrate and a second substrate including a second metal pad are brought together so that a cavity is formed between the first metal pad and the second metal pad on one side of a plane which dielectric materials of the first and second substrates make a physical contact. The two substrates are placed in a plating bath and a conductive material is plated in the cavity between the first metal pad and the second metal pad to form a contiguous plated metal liner layer that adheres to a surface of the first metal pad and a surface of the second metal pad. The contiguous plated metal liner layer is self-aligned to the first metal pad, and enhances mechanical adhesion across the first and second metal pads.

According to an aspect of the present invention, a bonded structure is provided, which includes a first substrate including at least one first metal pad; a second substrate including at least one second metal pad in contact with a portion of the at least one first metal pad; and at least one interfacial metal liner portion contacting a surface of one of the at least one first metal pad and a surface of one of the at least one second metal pad.

According to another aspect of the present invention, another bonded structure is provided, which includes a first substrate including at least one first metal pad embedded in a first dielectric material layer; a second substrate including at least one second metal pad, wherein the at least one second metal pad is not in contact with the at least one first meal pad, and the at least one second metal pad is embedded in a second dielectric material layer in contact with the first dielectric material layer; and a contiguous metal liner layer contacting a first surface of one of the at least one first metal pad and a second surface of one of the at least one second metal pad. The contiguous metal liner layer has a periphery that vertically coincides with a periphery of the one of the at least one first metal pad.

According to yet another aspect of the present invention, a method of forming a bonded structure is provided. The method includes bringing a first substrate and a second substrate into contact with each other, wherein a first surface of a first metal pad embedded in the first substrate contacts a second surface of a second metal pad embedded in the second substrate; and forming at least one interfacial metal liner portion directly on the first surface and the second surface by plating a conductive material, whereby the at least one interfacial metal liner portion enhances mechanical adhesion between the first metal pad and the second metal pad.

According to still another aspect of the present invention, another method of forming a bonded structure is provided. The method includes recessing a first surface of a first metal pad embedded in a first dielectric material layer of a first substrate, whereby the first surface is recessed relative to a first dielectric surface of the first dielectric material layer; bringing the first substrate and a second substrate into contact with each other, wherein the first dielectric surface contacts a second dielectric surface of a second dielectric material layer embedded in the second substrate; and forming a contiguous metal liner layer contacting the first surface and a second surface of a second metal pad in the second substrate, whereby the contiguous metal liner layer enhances mechanical adhesion between the first metal pad and the second metal pad.

DETAILED DESCRIPTION

As stated above, the present invention relates to bonded structures including a self-aligned liner that bonds metal pads located on each side of bonded substrates and methods of manufacturing the same, which are now described in detail with accompanying figures. The drawings are not necessarily drawn to scale.

As used herein, a feature is "microscopic" if the dimensions of the feature are identifiable only on a scale that is less than processing tolerances of a planarization process employed in the semiconductor industry. The microscopic tolerances of a planarization process includes but are not limited to, tolerances for scratches, dishing, non-uniform local removal rates, and can be less than 6 microns, and typically less than 1,000 nm.

As used herein, a feature is "macroscopic" if the dimensions of the feature are identifiable on a scale greater than processing tolerances of a planarization process employed in the semiconductor industry.

As used herein, a first surface is "coplanar" with a second surface if the plane of the first surface is identical to the plane of the second surface at a macroscopic level, i.e., when microscopic variations in surface features are ignored.

As used herein, "electroplating" is a plating process that uses electrical current to reduce cations of a desired material from a solution and coat a conductive object with a thin layer of the material, such as a metal.

As used herein, an "electroplatable material" is a material that can be deposited by an electroplating process that is currently known or to be discovered in the future.

As used herein, "electroless plating" is a plating process of a non-galvanic type that involves several simultaneous reactions in an aqueous solution, which occur through release of hydrogen by a reducing agent thereby producing a negative charge on the surface of the part without the use of external electrical power.

As used herein, a "electroless-platable material" is a material that can be deposited by an electroless plating process that is currently known or to be discovered in the future.

As used herein, a "microscopic variation in surface height" is a variation in the distance by which a surface deviates at a microscopic level in a direction normal to a flat plane that is identified with the surface at a macroscopic level.

As used herein, a periphery of a first element "vertically coincides" with a periphery of a second element if the entirety of the periphery of first element overlies or underlies the entirety of the periphery of the second element and if the entirety of the periphery of second element underlies or overlies the entirety of the periphery of the first element. A periphery of a first element that vertically coincides with a periphery of a second element is necessarily congruent with the periphery of the second element.

Figure 1:
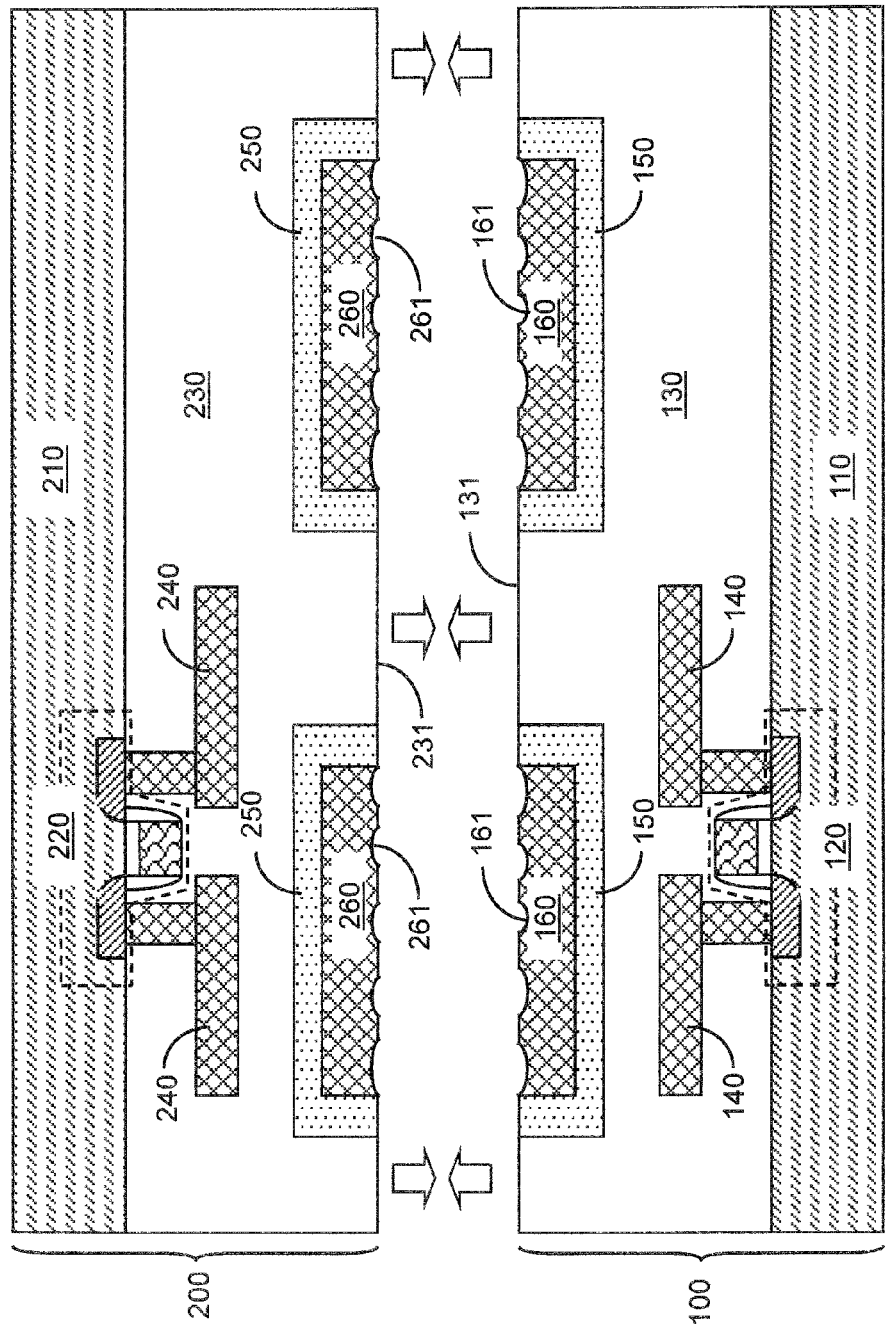
FIG. 1 is vertical cross-sectional view of a first exemplary structure prior to bonding two substrates according to a first embodiment of the present invention.

Referring to FIG. 1, a first exemplary structure according to a first embodiment of the present invention includes a first substrate 100 and a second substrate 200 facing each other. The first substrate 100 can include a first semiconductor substrate 110 and at least one first dielectric material layer 130 located thereupon. The second substrate 200 can include a second semiconductor substrate 210 and at least one second dielectric material layer 230 located thereupon. Each of the first and second semiconductor substrates (110, 210), if present, comprises a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material can be silicon. Each of the first and second semiconductor substrates (110, 210) can be single crystalline. Each of the first substrate 100 and the second substrate 200 can include at least another substrate layer in addition to, or instead of, the first or second semiconductor substrates (110 or 210).

If the first substrate 100 includes a first semiconductor substrate 110, at least one first semiconductor device 120 can be present on the first semiconductor substrate 110. Likewise, if the second substrate 200 includes a second semiconductor substrate 210, at least one second semiconductor device 220 can be present on the second semiconductor substrate 210. Each of the at least one first semiconductor device 120 and the at least one second semiconductor device 220 can be, but is not limited to, a field effect transistor, a bipolar transistor, a diode, a resistor, a capacitor, a varactor, an inductor, a carbon nanotube device, or any other type of semiconductor device or a nanoscale device.

Each of the at least one first dielectric material layer 130 and the at least one second dielectric material layer 230 includes at least one dielectric material, which can be a doped or undoped silicate glass, silicon nitride, a low dielectric constant (low-k) chemical vapor deposition (CVD) material such as organosilicate glass, a low-k spin-on dielectric material such as SiLK™, BLoK™, NBLoCK™, or any other type of dielectric material that can be deposited or formed on a substrate and able to hold at least one metal pad therein. Further, at least one first metal interconnect structure 140 can be embedded in the at least one first dielectric material layer 130 to provide electrical connection to the at least one first semiconductor device 120. Likewise, at least one second metal interconnect structure 240 can be embedded in the at least one second dielectric material layer 240 to provide electrical connection to the at least one second semiconductor device 220.

The exposed surface of the at least one first dielectric material layer 130 is herein referred to as a first dielectric surface 131, which is planar at a macroscopic level, although microscopic variations in height is inherently present in the first dielectric surface 131 as most surfaces of manufactured structures. The first dielectric material surface 131 can be made planar at a macroscopic level, for example, by a deposition of a dielectric material on an underlying macroscopically planar surface, by a planarization process such as chemical mechanical planarization (CMP), by employing a self-planarizing material within the at least one first dielectric material layer 130, and/or by a combination thereof. Likewise, the exposed surface of the at least one second dielectric material layer 230 is herein referred to as a second dielectric surface 231, which is planar at a macroscopic level, although microscopic variations in height is inherently present in the second dielectric surface 231 as most surfaces of manufactured structures. The second dielectric material surface 231 can be made planar at a macroscopic level employing the methods described above for the first dielectric material surface 131.

At least one first metal pad 160 is embedded in the at least one first dielectric material layer 130. The at least one first metal pad 160 can include a metal and/or a conductive metal nitride material. For example, the metal can be, but is not limited to, Cu, W, Au, Ag, Ni, Ti, Ta, Sn, Zn, and alloys thereof. The conductive metal nitride can be, but is not limited to, TaN, TiN, and WN. Each of the at least one first metal pad 160 has an exposed surface, which is herein referred to as a first surface 161. The first surfaces 161 are coplanar with the first dielectric surface 131 at a macroscopic level, but have variations in height at a microscopic level. Thus, some portions of the first surface 161 protrude above the macroscopic plane defined by the first dielectric surface 131 at a microscopic level, and some other portions of the first surface 161 are recessed below the macroscopic plane defined by the first dielectric surface 131 at the microscopic level.

The microscopic variation in surface height of each first surface 161 is magnified in scale in FIG. 1 to illustrate the presence of the microscopic variation although such a microscopic variation in surface height is not normally detectable at a macroscopic level, i.e., but for the magnification in the vertical scale of the features of the first surfaces 161, the first surfaces 161 would be flat surfaces if illustrated at a macroscopic level in the same manner employed for other elements in FIG. 1. The microscopic variation in surface height of each first surface 161 can be introduced, for example, by dishing in a chemical mechanical planarization process, by scratching in a chemical mechanical planarization process, grain structures in the at least one first metal pad 160, and/or local non-uniformity in topography of the first surfaces 161 as a result of non-uniformity in a processing step. The microscopic variation in surface height of each first surface 161 is typically less than 3 microns, and more typically less than 500 nm, and most typically from 10 nm to 300 nm, although lesser and greater microscopic variation in surface height of each first surface 161 are also contemplated herein.

At least one second metal pad 260 is embedded in the at least one second dielectric material layer 230. The at least one second metal pad 260 can include a metal and/or a conductive metal nitride material, which can be selected from the material for the metal and/or the conductive metal nitride material for the at least one first metal pad 160. The at least one second metal pad 260 can have the same material as, or a different material from, the at least one first metal pad 160. Each of the at least one second metal pad 260 has an exposed surface, which is herein referred to as a second surface 261. The second surfaces 261 are coplanar with the second dielectric surface 231 at a macroscopic level, but have variations in height at a microscopic level. Thus, some portions of the second surface 261 protrude above the macroscopic plane defined by the second dielectric surface 231 at a microscopic level, and some other portions of the second surface 261 are recessed below the macroscopic plane defined by the second dielectric surface 231 at the microscopic level.

The microscopic variation in surface height of each second surface 261 is also magnified in scale in FIG. 1 to illustrate the presence of the microscopic variation although such a microscopic variation in surface height is not normally detectable at a macroscopic level. The microscopic variation in surface height of each second surface 261 can be introduced by the same mechanism during processing steps in the same manner as the microscopic variation in surface height of each first surface 261. The microscopic variation in surface height of each second surface 261 can have the same range of dimensions as the microscopic variation in surface height of each second surface 161.

A first diffusion barrier structure 150 can be employed between each of the at least one first metal pad 160 and the at least one first dielectric material layer 130. The first diffusion barrier structure(s) 150 can include a material that prevents or retards outdiffusion of material from the at least one first metal pad 160 and the at least one first dielectric material layer 130 or vice versa. For example, the first diffusion barrier structure(s) 150 can include a dielectric material, such as silicon nitride, that prevents or retards diffusion of a metallic material from the at least one first metal pad 160 or impurity atoms in the at least one first metal pad 160 or in the at least one first dielectric material layer 130. Alternatively or in addition, the first diffusion barrier structure(s) 150 can include a metallic material, such as TiN, TaN, WN, or a combination thereof, to prevent or retard diffusion of a metallic material or impurity atoms. A second diffusion barrier structure 250 can be employed between each of the at least one second metal pad 260 and the at least one second dielectric material layer 130 in the same manner as the first diffusion barrier structure(s) 150.

Preferably, the upper surface of the first substrate 100 including the first dielectric surface 131 and the first surfaces 161 is a minor image of the lower surface of the second substrate 200, when viewed flipped upside down as shown, including the second dielectric surface 231 and the second surfaces 261. The first substrate 100 and the second substrate 200 are brought into physical contact with each other such that the first dielectric surface 131 contacts the second dielectric surface 231 and the first surfaces 161 contact the second surfaces 261. The first substrate 100 and the second substrate 200 in the state of contact is herein referred to as an assembly of substrates (100, 200).

Figure 2:
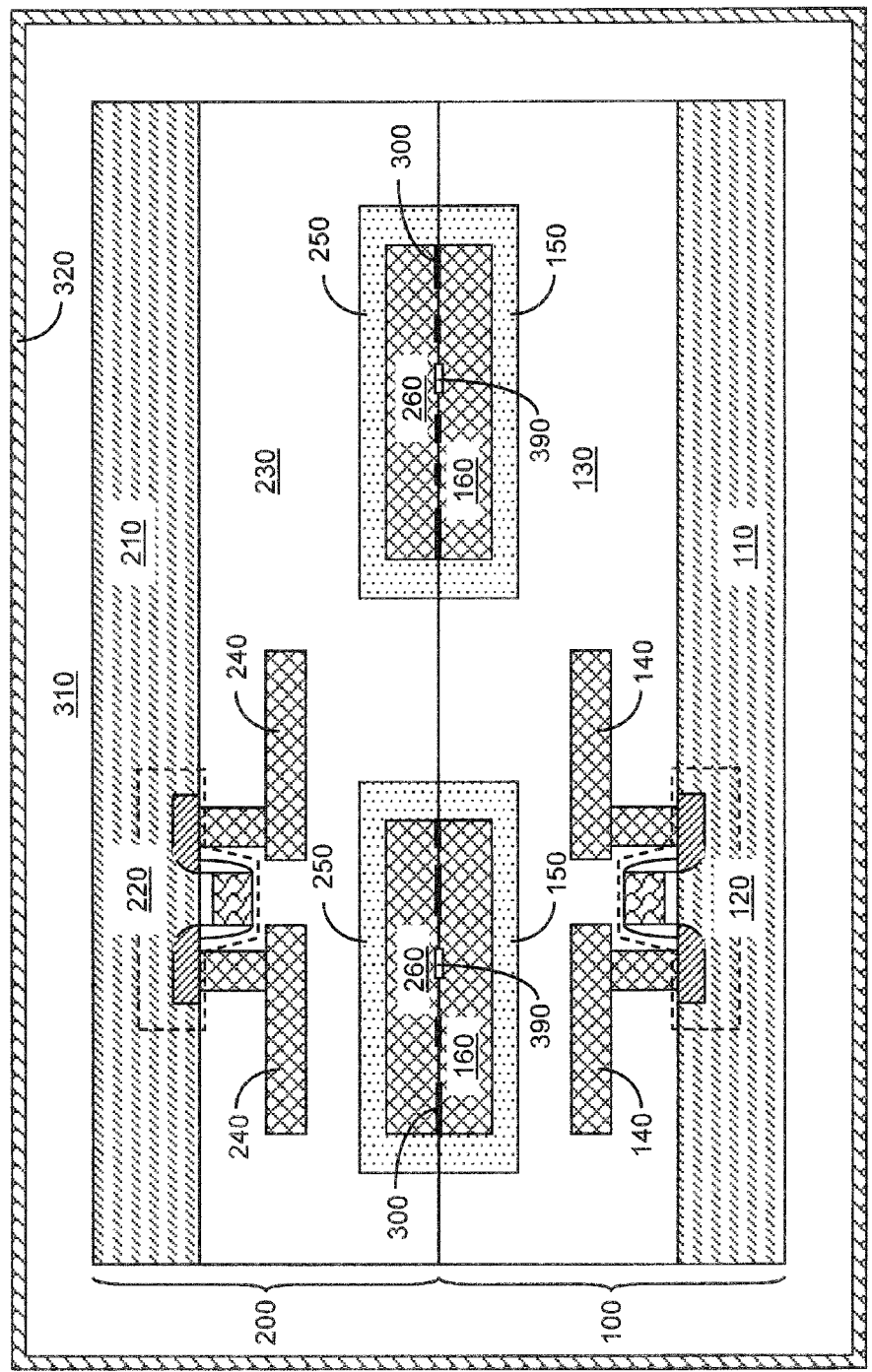
FIG. 2 is a vertical cross-sectional view of the first exemplary structure after plating in a plating bath according to the first embodiment of the present invention.

Referring to FIG. 2, the assembly of substrates (100, 200) is immersed in a plating bath 310, which can be contained in a bath enclosure 320. The plating bath can include an electrolyte solution employed for electroplating or an electrolyte solution employed for electroless plating. Any electroplating bath or any electroless plating bath known in the art can be employed for the plating bath 310.

An electroplating process or an electroless plating process is performed on the assembly of substrates (100, 200) employing the plating bath 310. On a microscopic scale, the solution of the plating bath 310 seeps through the interface between the first and second substrates (100, 200) because the molecules in the solution of the plating bath 310 are smaller than the microscopic variations in surface height of the first and second dielectric surfaces (131, 231; See FIG. 1) and the first and second surfaces (161, 261; See FIG. 1). The electroplating process or the electroless plating process deposits a conductive material selectively on metallic surfaces and does not deposit the conductive material on dielectric surfaces. Any known electroplating process or electroless plating process that deposits a conductive material only on metallic surfaces can be employed. Thus, deposition of the conductive material occurs only on the first and second surfaces (161, 261; See FIG. 1).

The deposited conductive material formed directly on the first surface(s) 161 and the second surface(s) 261 is herein referred to as "at least one interfacial metal liner portion 300."

The at least one interfacial metal liner portion 300 is formed at each interface between a first metal pad 160 and a second metal pad 260. Each of the at least one interfacial metal liner portion 300 comprises a metal that is plated by electroplating or electroless plating. The at least one interfacial metal liner portion 300 can be composed of Ni, Au, Ag, Rh, Ru, Ir, Cr, Sn, Zn, Cd, Co(W,P,B), any other electroplatable material, or any other electroless-platable material. The at least one interfacial metal liner portion 300 is formed as a liner having a thickness than is typically less than lateral dimensions.

The at least one interfacial metal liner portion 300 has a variable thickness that does not exceed the sum of a first microscopic variation in surface height in the at least one first metal pad 160 and a second microscopic variation in surface height in the at least one second metal pad 260. In other words, the thickness of the at least one interfacial metal liner portion 300 does not exceed the sum of the microscopic variation in surface height of the first surfaces 161 and the microscopic variation in surface height of the second surfaces 261. The variable thickness can randomly vary across the at least one interfacial metal liner portion 300 on a microscopic scale. The at least one interfacial metal liner portion 300 extends across the interface between the first substrate 100 and the second substrate 200, i.e., in a direction along a surface normal of the interface, by no more than microscopic height variations on surfaces of the at least one first metal pad 160 and the at least one second metal pad 260. Typically, the thickness of the at least one interfacial metal liner portion 300 is less than 6 microns, and more typically less than 1,000 nm, and most typically from 2 nm to 600 nm, although lesser and greater thickness of the at least one interfacial metal liner portion 300 can be employed depending on the microscopic variations in surface height of the first and second surfaces (161, 261).

Between a first metal pad 160 and a second metal pad 260 contacting a portion of the first metal pad 160, there can be one or more interfacial metal liner portions 300 depending on the topography of the first and second surfaces (161, 261; See FIG. 1) at a microscopic level. Each of the at least one interfacial metal liner portion 300 provides adhesion between a first metal pad 160 and a second metal pad 260.

At a microscopic level, the at least one interfacial metal liner portion 300 is formed by filling at least one cavity at an interface between a metal pad 160 and a second metal pad 260. Each of the at least one cavity has a variable thickness that does not exceed the sum of a first microscopic variation in surface height in the first metal pad 160 and a second microscopic variation in surface height in the second metal pad 260. Because formation of the at least one interfacial metal liner portion 300 requires diffusion of the solution in the plating bath 310 along microscopic cavities formed at the interface between the first and second substrates (100, 200), the at least one interfacial metal liner portion 300 is not formed in an area at which a first metal pad 160 contacts a second metal pad 260 at a microscopic level.

Figure 3:
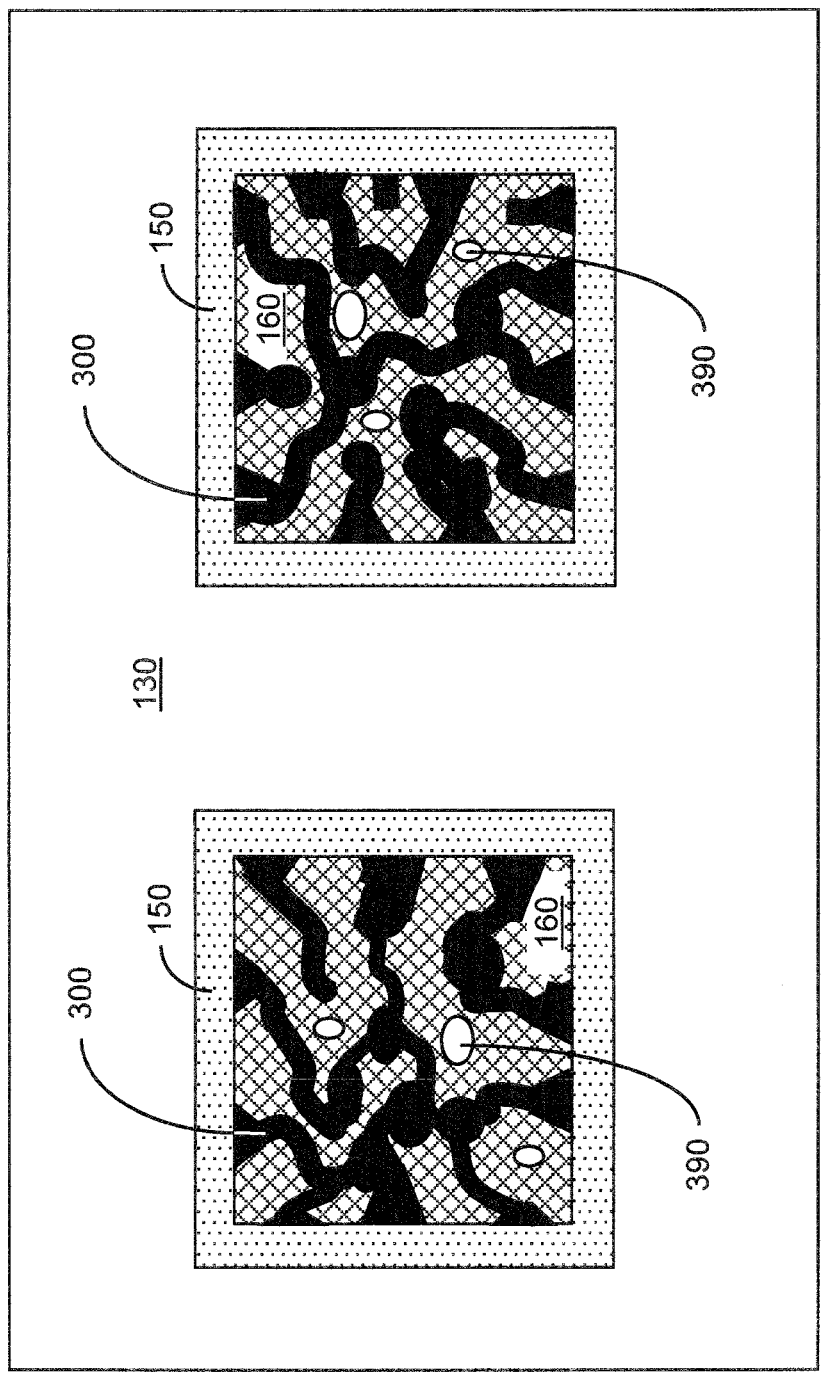
FIG. 3 is a horizontal cross-sectional view of the first exemplary structure after plating along the plane of an interface between two substrates according to the first embodiment of the present invention.

Referring to FIG. 3, a horizontal cross-sectional view of the first exemplary structure after plating is shown along the plane of an interface between the first and second substrates (100, 200). The horizontal cross-sectional view of FIG. 3 is a view in a direction towards the first substrate 100. The first exemplary structure is a bonded structure at this step, and includes the first substrate 100, the second substrate 200, and the at least one interfacial metal liner portion 300. The extent of the at least one interfacial metal liner portion 300 is limited to areas in which the at least one first metal pad 160 does not contact the at least one second metal pad 260 at a microscopic level, i.e., to areas at which microscopic cavities are present at the interface between the at least one first metal pad 160 and the at least one second metal pad 260.

If a microscopic cavity between a first metal pad 160 and a second metal pad 260 contiguously extends to an edge of the first or second metal pad (160, 260), the solution in the plating bath 310 (See FIG. 2) flows into the microscopic cavity, thereby filling the microscopic cavity and forming one of the at least one interfacial metal liner portion 300.

If a microscopic cavity a first metal pad 160 and a second metal pad 260 is laterally surrounded by an area in which the first metal pad 160 contacts a second metal pad 260 at a microscopic level, the solution in the plating bath 310 (See FIG. 2) does not flow into that cavity, and that cavity remains unfilled by a conductive material, i.e., becomes an "unfilled cavity" 390 that remains under vacuum or contains an ambient gas trapped when the first and second substrates (100, 200) are initially brought together. Each unfilled cavity 390 is encapsulated and sealed by a surrounding contact area between the first and second substrates (100, 200).

Each of the at least one second metal pad 260 includes a portion that is in contact with a portion of the at least one first meal pad 160. Each of the at least one interfacial metal liner portion 300 contacts a surface of one of the at least one first metal pad 160 in FIG. 1, i.e., a first surface 161, and a surface of one of the at least one second metal pad 260, i.e., a second surface 261 in FIG. 1.

Because the at least one interfacial metal liner portion 300 provides adhesion to the at least one first metal pad 160 and the at least one second metal pad 260, the material of the at least one first metal pad 160 can be the same as, or different from, the material of the at least one second metal pad 260. Further, the material of the at least one interfacial metal liner portion 300 can be the same as the material of one of the at least one first metal pad 160 and the at least one second metal pad 260, or can be different from the materials of the at least one first metal pad 160 and the at least one second metal pad 260.

Figure 4:
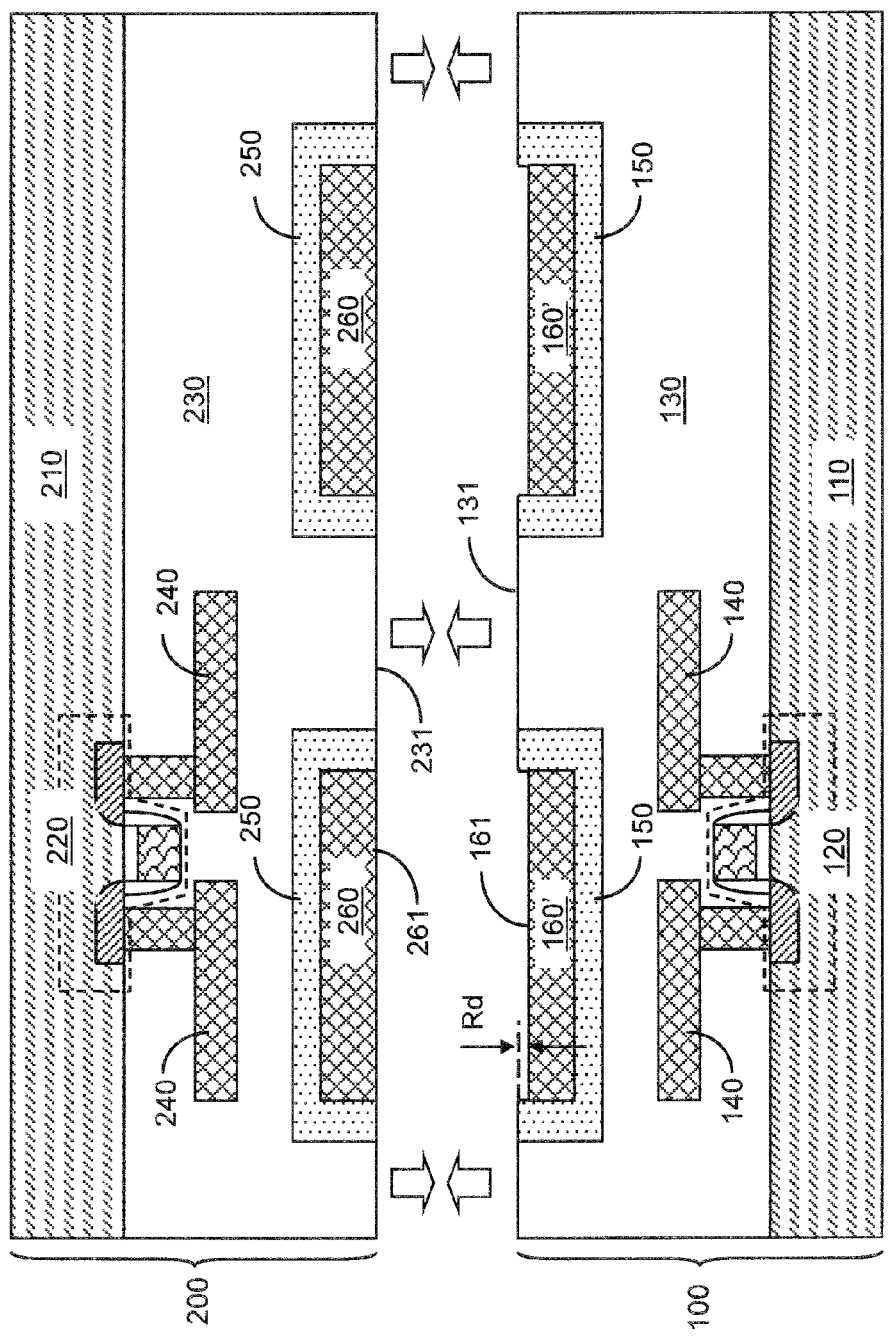
FIG. 4 is vertical cross-sectional view of a second exemplary structure prior to bonding two substrates according to a second embodiment of the present invention.

Referring to FIG. 4, a second exemplary structure according to a second embodiment of the present invention includes a first substrate 100 and a second substrate 200, each of which can the same as the first substrate 100 and the second substrate 200, respectively, in the first exemplary structure of FIG. 1 as described above.

Before the first substrate 100 and the second substrate 200 are brought into physical contact, the first surface(s) 161 of the at least one first metal pad 160 is/are recessed by a recess depth Rd relative to the first dielectric surface 131 of the at least one first dielectric material layer 130. The recess depth Rd can be from 5 nm to 3,000 nm, and typically from 30 nm to 300 nm, although lesser and greater recess depths can also be employed.

After recessing the first surface(s) 161 of the at least one first metal pad 160, the first substrate 100 and the second substrate 200 are brought into physical contact with each other in the same manner as in the first embodiment. However, due to the recessing of the first surface(s) 161 of the at least one first metal pad 160 relative to the first dielectric surface 131, the first surface(s) 161 do(es) not contact any of the second surface(s) 261.

Preferably, the upper surface of the first substrate 100 including the first dielectric surface 131 and the first surfaces 161 is a minor image of the lower surface of the second substrate 200, when viewed flipped upside down as shown, including the second dielectric surface 231 and the second surfaces 261. A cavity is formed between each pair of a first metal pad 160 and a second metal pad 260 that face each other. The height of the cavity is the same as the recess depth Rd. The first dielectric surface 131 contacts the second dielectric surface after the first and second substrates (100, 200) are brought into contact with each other. The first substrate 100 and the second substrate 200 in the state of contact is herein referred to as an assembly of substrates (100, 200).

Figure 5:
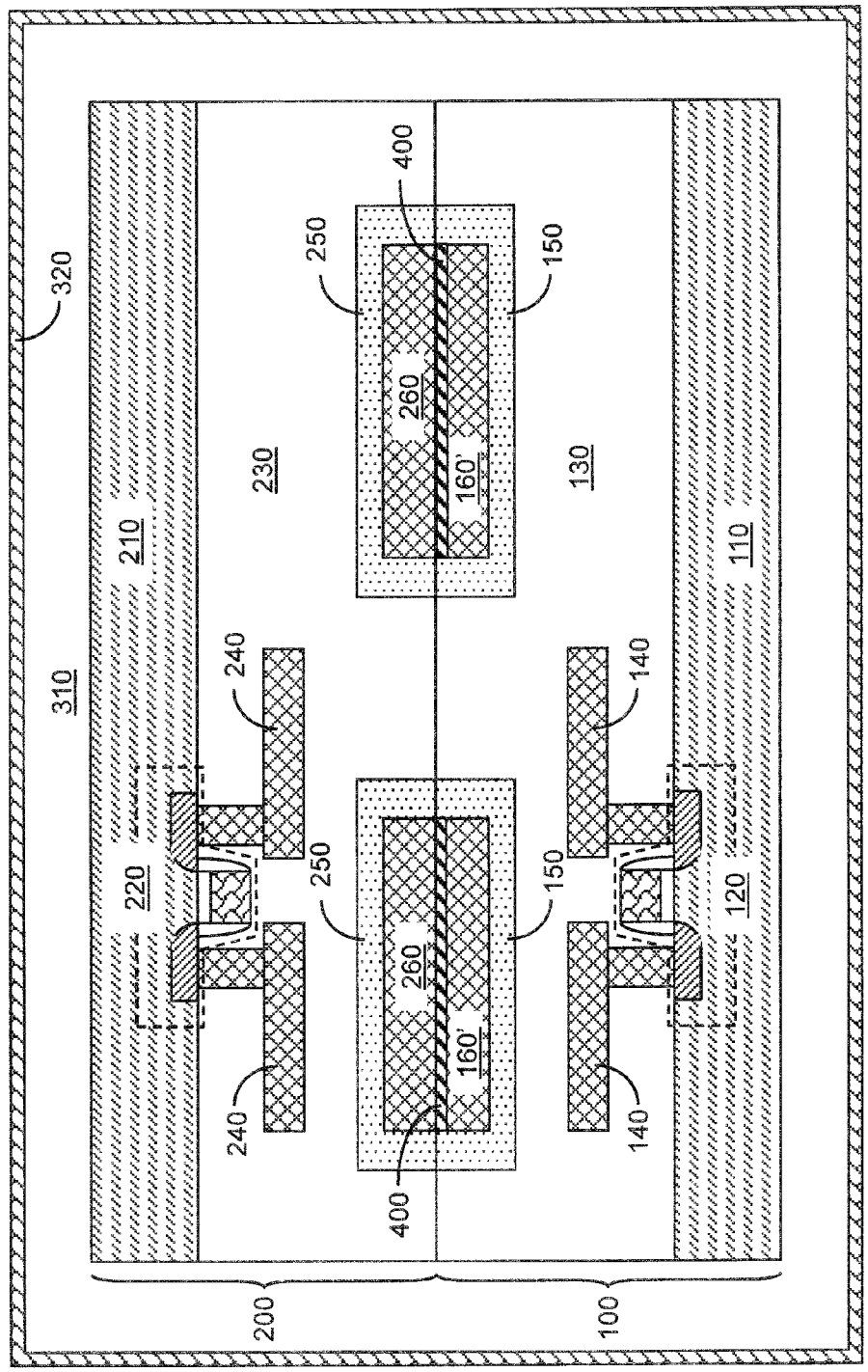
FIG. 5 is a vertical cross-sectional view of the second exemplary structure after plating in a plating bath according to the second embodiment of the present invention.

Referring to FIG. 5, the assembly of substrates (100, 200) is immersed in a plating bath 310, which can be contained in a bath enclosure 320, in the same manner as in the first embodiment. The plating bath can include an electrolyte solution employed for electroplating or an electrolyte solution employed for electroless plating as in the first embodiment. An electroplating process or an electroless plating process is performed on the assembly of substrates (100, 200) employing the plating bath 310.

The solution of the plating bath 310 seeps through the interface between the first and second dielectric surfaces (131, 231; See FIG. 4) and flows into at least one cavity between the at least one first metal pad 160 and the at least one second metal pad 260. The electroplating process or the electroless plating process deposits a conductive material selectively on metallic surfaces of the at least one first metal pad 160 and the at least one second metal pad 260. However, the conductive material is not deposited on dielectric surfaces. Thus, deposition of the conductive material occurs only on the first and second surfaces (161, 261; See FIG. 4).

The deposited conductive material formed directly on the first surface 161 and the second surface 261 is herein referred to as "at least one contiguous metal liner layer 400." Each of the at least one contiguous metal liner layer 400 is formed by filling a cavity between a first metal pad 160 and a second metal pad 260. Each of the at least one contiguous metal liner layer 400 comprises a metal that is plated by electroplating or electroless plating. The at least one contiguous metal liner layer 400 can be composed of Ni, Au, Ag, Rh, Ru, Ir, Cr, Sn, Zn, Cd, Co(W, P, B), any other electroplatable material, or any other electroless-platable material. The at least one contiguous metal liner layer 400 is formed as a layer having a uniform thickness at a macroscopic level, which can be from 5 nm to 3,000 nm, although lesser and greater thicknesses can be employed.

Each of the at least one contiguous metal liner layer 400 contacts one of the at least one second metal pad 260 in a plane that is coplanar with the interface between the at least one first dielectric material layer 130 and the at least one second dielectric material layer 230. Each of the at least one contiguous metal liner layer 400 is a single contiguous piece having a pair of parallel surfaces, i.e., a surface that contacts a first metal pad 160 and another surface that contacts a second metal pad 260. Each of the at least one contiguous metal liner layer 400 provides adhesion between a first metal pad 160 and a second metal pad 260. The second surface(s) of the at least one second metal pad 260 is coplanar with the second dielectric surface 231 (See FIG. 4) which coincides with the first dielectric surface 131 (See FIG. 4). Each of the at least one contiguous metal liner layer 400 has a periphery that vertically coincides with a periphery of the one of the at least one first metal pad 160.

Figure 6:
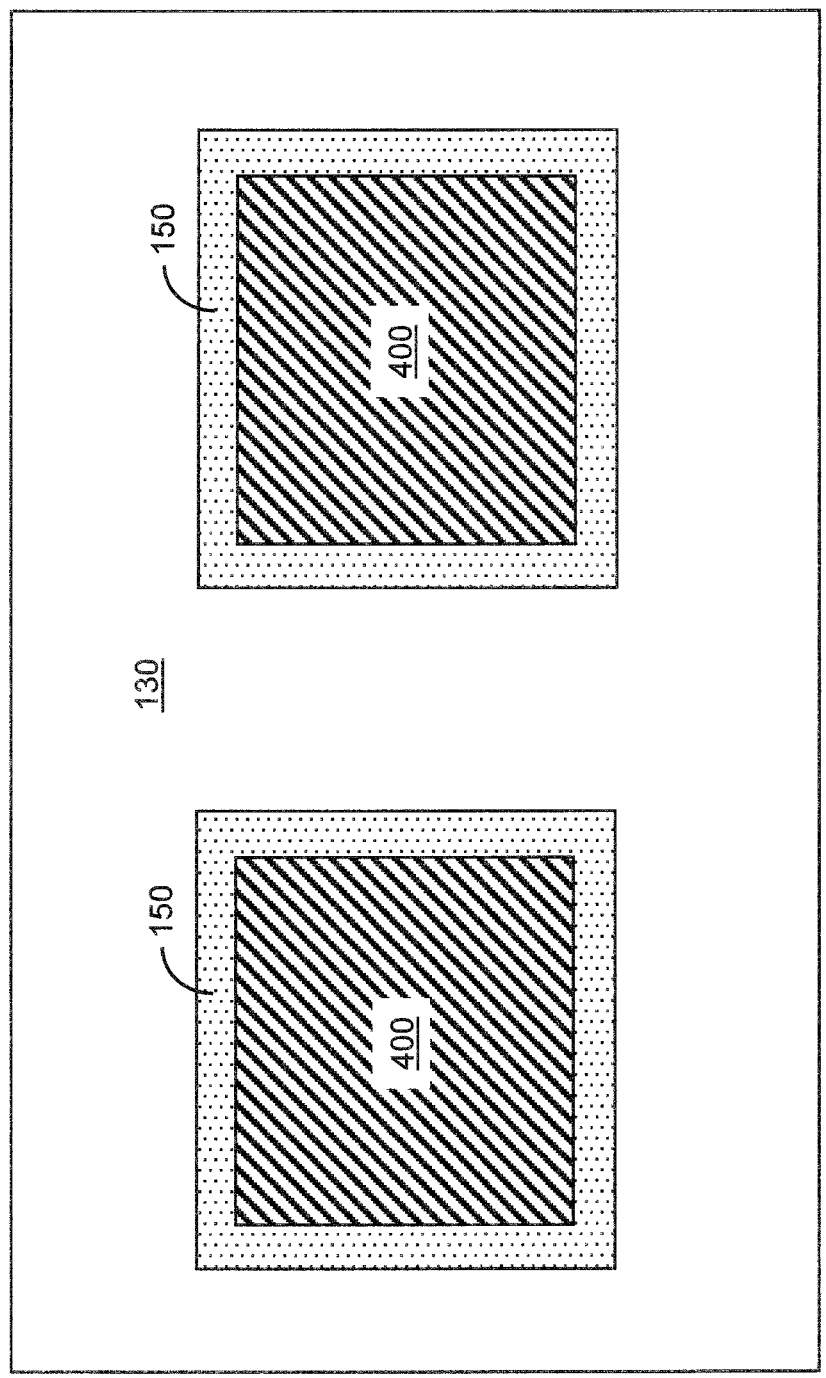
FIG. 6 is a horizontal cross-sectional view of the second exemplary structure after plating along the plane of an interface between two substrates according to the second embodiment of the present invention.

Referring to FIG. 6, a horizontal cross-sectional view of the second exemplary structure after plating is shown along the plane of an interface between the first and second substrates (100, 200). The horizontal cross-sectional view of FIG. 6 is a view in a direction towards the first substrate 100. The second exemplary structure is a bonded structure at this step, and includes the first substrate 100, the second substrate 200, and the at least one contiguous metal liner layer 400. Each pair of a first metal pad 160 and a second metal pad 260 is spaced by one of the at least one contiguous metal liner layer 400.

Each of the at least one contiguous metal liner layer 400 contacts a surface of one of the at least one first metal pad 160, i.e., a first surface 161 in FIG. 4, and a surface of one of the at least one second metal pad 260, i.e., a second surface 261 in FIG. 4. Because the at least one contiguous metal liner layer 400 provides adhesion to the at least one first metal pad 160 and the at least one second metal pad 260, the material of the at least one first metal pad 160 can be the same as, or different from, the material of the at least one second metal pad 260. Further, the material of the at least one contiguous metal liner layer 400 can be the same as the material of one of the at least one first metal pad 160 and the at least one second metal pad 260, or can be different from the materials of the at least one first metal pad 160 and the at least one second metal pad 260.

Figure 7:
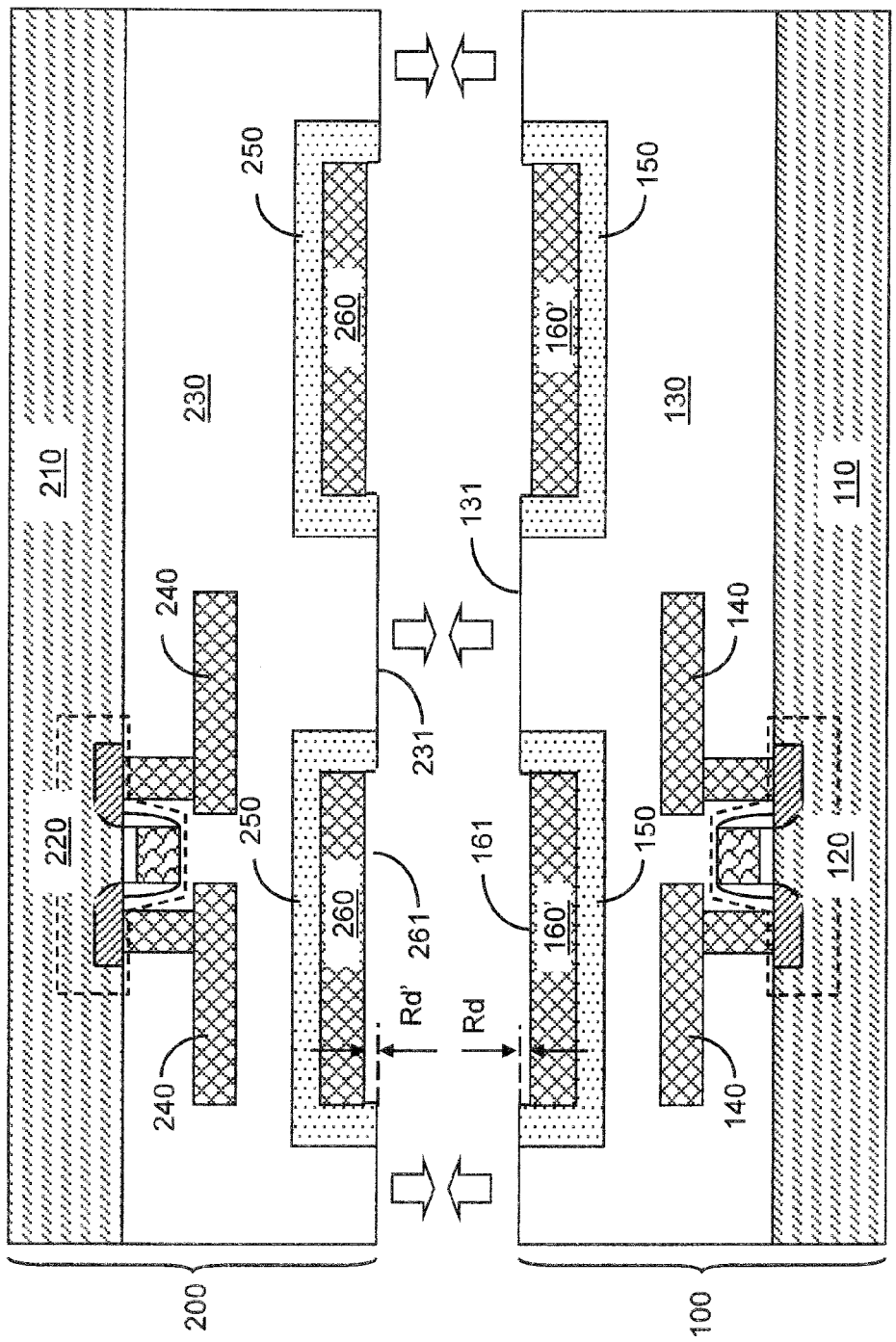
FIG. 7 is vertical cross-sectional view of a third exemplary structure prior to bonding two substrates according to a third embodiment of the present invention.

Referring to FIG. 7, a third exemplary structure according to a third embodiment of the present invention includes a first substrate 100 and a second substrate 200, each of which can the same as the first substrate 100 and the second substrate 200, respectively, in the first exemplary structure of FIG. 1 as described above.

Before the first substrate 100 and the second substrate 200 are brought into physical contact, the first surface(s) 161 of the at least one first metal pad 160 is/are recessed by a recess depth Rd relative to the first dielectric surface 131 of the at least one first dielectric material layer 130 as in the second embodiment. In addition, before the first substrate 100 and the second substrate 200 are brought together, the second surface(s) 261 of the at least one second metal pad 260 is/are recessed by another recess depth Rd' relative to the second dielectric surface 231 of the at least one second dielectric material layer 230. The recess depths Rd and Rd' can be from 5 nm to 3,000 nm, and typically from 30 nm to 300 nm, although lesser and greater recess depths can also be employed.

After recessing the first surface(s) 161 and the second surface(s) 261, the first substrate 100 and the second substrate 200 are brought into physical contact with each other in the same manner as in the first and second embodiments. The first surface(s) 161 do(es) not contact any of the second surface(s) 261.

Preferably, the upper surface of the first substrate 100 including the first dielectric surface 131 and the first surfaces 161 is a minor image of the lower surface of the second substrate 200, when viewed flipped upside down as shown, including the second dielectric surface 231 and the second surfaces 261. A cavity is formed between each pair of a first metal pad 160 and a second metal pad 260 that face each other. The height of the cavity is the same as the sum of the recess depth Rd and the recess depth Rd'. The first dielectric surface 131 contacts the second dielectric surface after the first and second substrates (100, 200) are brought into contact with each other. The first substrate 100 and the second substrate 200 in the state of contact is herein referred to as an assembly of substrates (100, 200).

Figure 8:
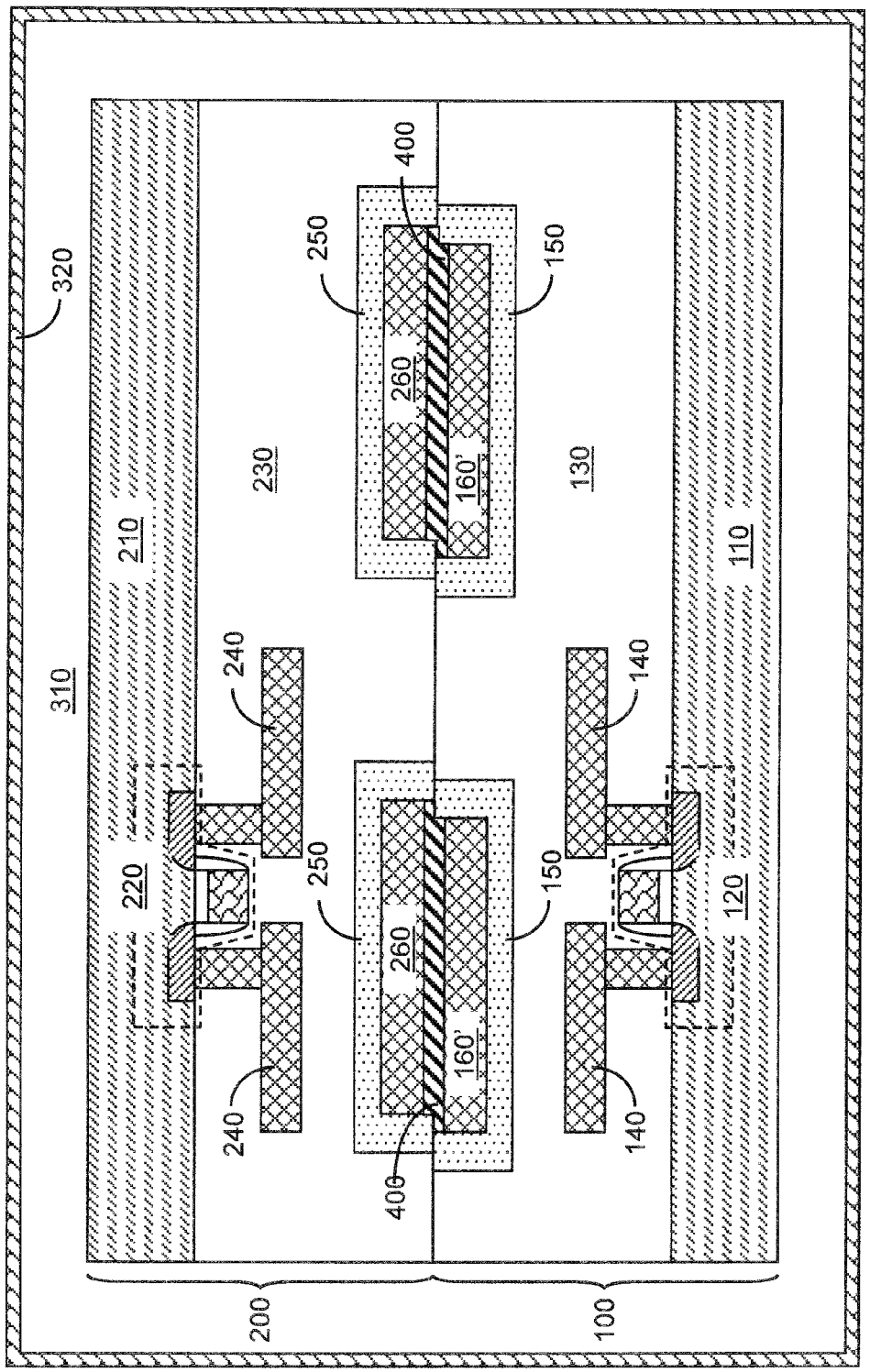
FIG. 8 is a vertical cross-sectional view of the third exemplary structure after plating in a plating bath according to the third embodiment of the present invention.

Referring to FIG. 8, the assembly of substrates (100, 200) is immersed in a plating bath 310, which can be contained in a bath enclosure 320, in the same manner as in the first and embodiments. An electroplating process or an electroless plating process is performed on the assembly of substrates (100, 200) employing the plating bath 310 in the same manner as in the first and second embodiments.

The solution of the plating bath 310 seeps through the interface between the first and second dielectric surfaces (131, 231; See FIG. 7) and flows into at least one cavity between the at least one first metal pad 160 and the at least one second metal pad 260. The electroplating process or the electroless plating process deposits a conductive material selectively on metallic surfaces of the at least one first metal pad 160 and the at least one second metal pad 260. Thus, deposition of the conductive material occurs only on the first and second surfaces (161, 261; See FIG. 7).

The deposited conductive material formed directly on the first surface 161 and the second surface 261 is herein referred to as "at least one contiguous metal liner layer 400." Each of the at least one contiguous metal liner layer 400 is formed by filling a cavity between a first metal pad 160 and a second metal pad 260. Each of the at least one contiguous metal liner layer 400 can comprise the same material as the at least one contiguous metal liner layer 400 of the second exemplary structure or the at least one interfacial metal liner portion 300 of the first exemplary structure. The at least one contiguous metal liner layer 400 is formed as a layer having a uniform thickness at a macroscopic level, which can be from 10 nm to 6,000 nm, although lesser and greater thicknesses can be employed.

Each of the at least one contiguous metal liner layer 400 is formed on both sides of a plane at which the at least one second dielectric material layer 230 contacts the at least one first dielectric material layer 130. Therefore, a plane at which the at least one second dielectric material layer 230 contacts the at least one first dielectric material layer 130 is different from a plane of the first surface at which a contiguous metal liner layer 400 contacts a first metal pad 160, and is different from a plane of the second surface at which the contiguous metal liner layer 400 contacts a second metal pad 160.

Each of the contiguous metal liner layer 400 has a periphery that vertically coincides with a periphery of a first metal pad 160. If the periphery of a first metal pad 160 vertically coincides with the periphery of a second metal pad 260, the periphery of a contiguous metal liner layer 400 can vertically coincide with the periphery of the first metal pad 160 in contact with the contiguous metal liner layer 400, and also vertically coincide with the periphery of the second metal pad 260 in contact with the contiguous metal liner layer 400.

If the periphery of a first metal pad 160 does not vertically coincides with the periphery of a second metal pad 260, the contiguous metal liner layer 400 in contact with the first metal pad 160 and the second metal pad 260 has a first periphery that vertically coincides with the periphery of the first metal pad 160 and a second periphery that vertically coincides with the periphery of the second metal pad 260. The first periphery of the contiguous metal liner layer 400 does not vertically coincide with the second periphery of the contiguous metal liner 400.

Each of the at least one contiguous metal liner layer 400 is a single contiguous piece having a pair of parallel surfaces, i.e., a surface that contacts a first metal pad 160 and another surface that contacts a second metal pad 260. Each of the at least one contiguous metal liner layer 400 provides adhesion between a first metal pad 160 and a second metal pad 260.

Each of the at least one contiguous metal liner layer 400 contacts a surface of one of the at least one first metal pad 160, i.e., a first surface 161 in FIG. 7, and a surface of one of the at least one second metal pad 260, i.e., a second surface 261 in FIG. 7. Because the at least one contiguous metal liner layer 400 provides adhesion to the at least one first metal pad 160 and the at least one second metal pad 260, the material of the at least one first metal pad 160 can be the same as, or different from, the material of the at least one second metal pad 260. Further, the material of the at least one contiguous metal liner layer 400 can be the same as the material of one of the at least one first metal pad 160 and the at least one second metal pad 260, or can be different from the materials of the at least one first metal pad 160 and the at least one second metal pad 260.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A method of forming a bonded structure, said method comprising:
   bringing a first substrate and a second substrate into contact with each other, wherein a first surface of a first metal pad embedded in said first substrate contacts a second surface of a second metal pad embedded in said second substrate; and
   forming at least one interfacial metal liner portion directly on said first surface and said second surface by plating a conductive material, whereby said at least one interfacial metal liner portion provides adhesion between said first metal pad and said second metal pad, wherein said at least one interfacial metal liner portion is formed by filling at least one cavity at an interface between said first metal pad and said second metal pad, and said at least one cavity has a variable thickness that does not exceed the sum of a first microscopic variation in surface height in said at least one first metal pad and a second microscopic variation in surface height in said at least one second metal pad.

2. The method of claim 1, wherein said at least one interfacial metal liner portion is formed in a plating bath by electroplating or electroless plating.

3. The method of claim 1, wherein a first dielectric material layer located within said first substrate contacts a second dielectric material layer located within said second substrate.

4. The method of claim 3, wherein said plating deposits said conductive material selectively on metallic surfaces and does not deposit said conductive material on dielectric surfaces.

5. The method of claim 1, wherein said forming of said at least one interfacial metal liner portion comprises forming an unfilled cavity within said at least one interfacial metal liner portion, wherein said unfilled cavity includes vacuum or ambient gas trapped therein.

6. The method of claim 1, wherein said at least one interfacial metal liner is not formed in a region in which said first surface and said second surface are in contact with each other at a microscopic level.

7. The method of claim 1, wherein an extent of said at least one interfacial metal liner is limited within areas in which said first surface and said second surface are not in contact with each other at a microscopic level.

8. The method of claim 1, further comprising:
   forming a first diffusion barrier structure within said first substrate prior to brining said first and second substrates into contact, wherein said first metal pad is formed on said first diffusion barrier structure; and
   forming a second diffusion barrier structure within said second substrate prior to brining said first and second substrates into contact, wherein said second metal pad is formed on said second diffusion barrier structure.

9. A method of forming a bonded structure, said method comprising:
   recessing a first surface of a first metal pad embedded in a first dielectric material layer of a first substrate, whereby said first surface is recessed relative to a first dielectric surface of said first dielectric material layer;

bringing said first substrate and a second substrate into contact with each other, wherein said first dielectric surface contacts a second dielectric surface of a second dielectric material layer embedded in said second substrate; and forming a contiguous metal liner layer contacting said first surface and a second surface of a second metal pad in said second substrate, whereby said contiguous metal liner layer provides adhesion between said first metal pad and said second metal pad, wherein said second surface of said second metal pad is coplanar with said second dielectric surface.

10. The method of claim 9, wherein said contiguous metal liner layer is formed in a plating bath by electroplating or electroless plating.

11. The method of claim 9, wherein said contiguous metal liner layer has a periphery that vertically coincides with a periphery of said one of said at least one first metal pad.

12. The method of claim 9, further comprising recessing said second surface of said second metal pad relative to said second dielectric surface prior to bringing said first and second substrates into contact.

13. The method of claim 12, wherein said contiguous metal liner layer is formed on both sides of a plane at which said second dielectric material layer contacts said first dielectric material layer.

14. The method of claim 13, wherein said contiguous metal liner layer is deposited selectively on metallic surfaces and is not deposited on dielectric surfaces during said forming of said contiguous metal liner layer.

15. The method of claim 13, wherein said contiguous metal liner layer has a first periphery that vertically coincides with a periphery of said first metal pad, and said contiguous metal liner layer has a second periphery that vertically coincides with a periphery of said second metal pad.

16. The method of claim 15, wherein said first periphery and said second periphery do not vertically coincide with each other.

17. The method of claim 13, wherein said contiguous metal liner layer has a periphery that vertically coincides with a periphery of said first metal pad and vertically coincides with a periphery of said second metal pad.

18. A method of forming a bonded structure, said method comprising:

bringing a first substrate and a second substrate into contact with each other, wherein a first surface of a first metal pad embedded in said first substrate contacts a second surface of a second metal pad embedded in said second substrate; and forming at least one interfacial metal liner portion directly on said first surface and said second surface by plating a conductive material, whereby said at least one interfacial metal liner portion provides adhesion between said first metal pad and said second metal pad, wherein said at least one interfacial metal liner is not formed in a region in which said first surface and said second surface are in contact with each other at a microscopic level.

19. The method of claim 18, wherein said forming of said at least one interfacial metal liner portion comprises forming an unfilled cavity within said at least one interfacial metal liner portion, wherein said unfilled cavity includes vacuum or ambient gas trapped therein.

20. The method of claim 18, wherein an extent of said at least one interfacial metal liner is limited within areas in which said first surface and said second surface are not in contact with each other at a microscopic level.

* * * * *